(12) United States Patent
Yamada et al.

(10) Patent No.: US 8,809,692 B2
(45) Date of Patent: *Aug. 19, 2014

(54) WIRING BOARD

(75) Inventors: Erina Yamada, Komaki (JP); Kazunaga Higo, Iida (JP); Hironori Sato, Kasugai (JP)

(73) Assignee: NGK Spark Plug Co., Ltd., Nagoya (JP)

(*) Notice: Subject to any disclaimer, the term of this patent is extended or adjusted under 35 U.S.C. 154(b) by 174 days.

This patent is subject to a terminal disclaimer.

(21) Appl. No.: 13/325,431

(22) Filed: Dec. 14, 2011

(65) Prior Publication Data

US 2012/0152596 A1 Jun. 21, 2012

(30) Foreign Application Priority Data

Dec. 15, 2010 (JP) ................................. 2010-279708

(51) Int. Cl.
*H05K 1/09* (2006.01)
*H01L 23/15* (2006.01)
*H01L 23/498* (2006.01)

(52) U.S. Cl.
CPC .......... *H01L 23/15* (2013.01); *H01L 23/49894* (2013.01); *H01L 23/49816* (2013.01)
USPC ......................................... 174/257; 174/260

(58) Field of Classification Search
CPC .............. H01L 23/15; H01L 23/49816; H01L 23/49894
USPC .......................................... 174/257, 258–262
See application file for complete search history.

(56) References Cited

U.S. PATENT DOCUMENTS 6,229,220 B1 5/2001 Saitoh et al.
7,216,424 B2 5/2007 Wang (Continued)

FOREIGN PATENT DOCUMENTS

CN 100452382 C 1/2009
CN 101410007 A 4/2009

(Continued)

OTHER PUBLICATIONS

Office Action dated Oct. 22, 2013, in related U.S. Appl. No. 13/325,767.

(Continued)

*Primary Examiner* — Yuriy Semenenko
(74) *Attorney, Agent, or Firm* — Stites & Harbison PLLC; Jeffrey A. Haeberlin; Nicolo Davidson (57) ABSTRACT

A wiring board including a conductor post corresponding to high-density packaging is provided. The wiring board may include a conductor layer, a solder resist layer laminated thereon, and a conductor post provided at least within the through-hole and that is electrically connected to a conductor layer which is disposed in a lower portion of a through-hole provided in the layer, wherein the solder resist layer comprises a thermosetting resin; the conductor post comprises tin, copper, or a solder and includes a lower conductor post located within the through-hole and an upper conductor post located above the lower conductor post and projected outside the layer; the lower conductor post includes an external alloy layer disposed on an external side surface thereof; and the conductor post is brought into intimate contact with an internal side surface of the through-hole via the external alloy layer.

6 Claims, 6 Drawing Sheets

(56) References Cited

U.S. PATENT DOCUMENTS

| | | | |
|---|---|---|---|
| 8,299,616 B2* | 10/2012 | Chuang et al. | 257/758 |
| 8,318,596 B2* | 11/2012 | Kuo et al. | 438/613 |
| 8,501,616 B2* | 8/2013 | Liu et al. | 438/613 |
| 8,507,376 B2 | 8/2013 | Ewert et al. | |
| 2005/0029110 A1 | 2/2005 | Tang et al. | |
| 2007/0079987 A1 | 4/2007 | Yamamichi et al. | |
| 2009/0008138 A1 | 1/2009 | Uchida et al. | |
| 2009/0260853 A1 | 10/2009 | Nagaya et al. | |
| 2010/0132998 A1 | 6/2010 | Lee et al. | |
| 2011/0075389 A1 | 3/2011 | Yamamichi et al. | |
| 2011/0189848 A1 | 8/2011 | Ewert et al. | |
| 2012/0152597 A1* | 6/2012 | Yamada et al. | 174/257 |
| 2012/0152598 A1* | 6/2012 | Yamada et al. | 174/257 |
| 2013/0213702 A1* | 8/2013 | Hsieh et al. | 174/257 |
| 2013/0214408 A1* | 8/2013 | Zhao et al. | 257/737 |

FOREIGN PATENT DOCUMENTS

| | | |
|---|---|---|
| JP | H06-138655 A | 5/1994 |
| JP | A-H09-97791 A | 4/1997 |
| JP | 2000-68626 A | 3/2000 |
| JP | 2000-332395 A | 11/2000 |
| JP | 2001-278947 A | 10/2001 |
| JP | 2007-270137 A | 10/2007 |
| JP | 2009-253294 A | 10/2009 |
| JP | 2010-129996 A | 6/2010 |
| KR | 2010-60968 A | 6/2010 |
| WO | 2010/046235 A1 | 4/2010 |

OTHER PUBLICATIONS

Korea Patent Office, Office Action issued in corresponding Korean application 10-2011-0135610, mailed Aug. 8, 2013.

Japanese Patent Office, Notification of Reasons for Refusal issued in corresponding Japanese application 2010-279708, dispatched Feb. 4, 2014.

SIPO, Notification of First Office Action issued in corresponding Chinese application 201110425532.6 issued Mar. 19, 2014.

Japanese Patent Office, Final Rejection issued in corresponding Japanese application 2010-279708, dispatched May 13, 2014.

* cited by examiner

WIRING BOARD

CROSS-REFERENCE TO RELATED APPLICATIONS

The present application claims priority from Japanese Patent Application No. 2010-279708, which was filed on Dec. 15, 2010, the disclosure of which is herein incorporated by reference in its entirety.

BACKGROUND OF THE INVENTION

1. Field of the Invention

The present invention relates to a wiring board. More particularly, certain embodiments of the present invention relate to wiring boards having a conductor post.

2. Description of Related Art

In recent years, as a technique for high-density packaging, for example, a C4 (controlled collapse chip connection) method has been adopted. Wiring boards utilized in C4 methods have a surface that is covered by a solder resist layer and a bump (conductor post) that is vertically arranged in an optionally bored opening in the solder resist layer. In such wiring boards, a conductor layer within the wiring board is electrically connected to the bump. In such wiring boards that utilize a bump, high-density packaging has allowed bump pitch to reach 145 μm. However, anticipating that high-density packaging will further proceed in the future, narrower bump pitches (e.g., 100 μm) may become necessary. In turn, these narrower bump pitches may require smaller diameter openings to be bored in solder resist layers. On the other hand, it may be possible that the height of bumps which are considered to be necessary will be utilized in the future. That is, it may be possible that bumps having higher aspect ratios will become necessary.

Current conventional technologies are described in U.S. Pat. No. 7,216,424, U.S. Pat. No. 6,229,220, and U.S. Patent Publication No. 2005/0029110.

BRIEF SUMMARY OF THE INVENTION

However, the formation of bumps having high aspect ratios necessary for the foregoing high-density packaging is relatively difficult. Generally known bump forming methods include a solder printing method and a ball mounting method.

Figure 7:
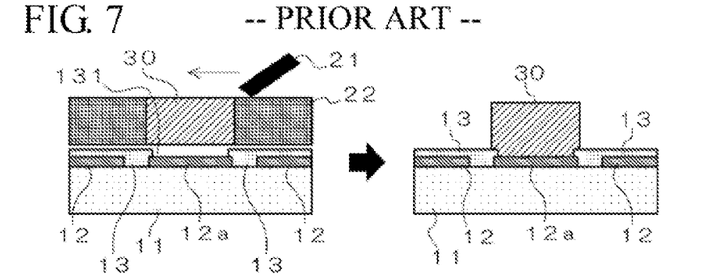
FIG. 7 is a schematic view showing a known solder printing manufacturing method.

In the solder printing method, a screen mask 22 is utilized along with a paste solder 30 that is printed using a squeegee 21, thereby forming a bump. As illustrated in FIG. 7, in the case where the thickness of a solder resist layer 13 is relatively thin and the size of the through-hole in the solder resist layer is sufficient, the paste solder 30 can be normally printed on a conductor layer 12a.

Figure 8:
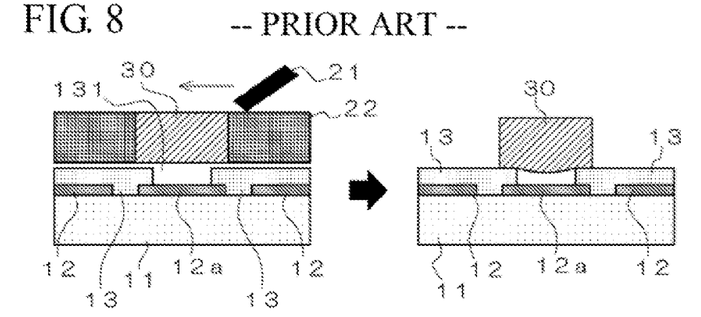
FIG. 8 is a schematic view showing a potential problem in the known solder printing manufacturing method.

However, in the case where the thickness of the solder resist layer 13 is relatively thick or the diameter of the through-hole 131 is relatively small, the fabrication of the mask 22 per se is difficult, and it is also difficult to sufficiently ensure its precision. Furthermore, even when a mask 22 can be formed, the diameter of the through-hole 131 to be opened in the mask 22 is relatively small, which may lead to clogging within the mask 22, poor paste solder 30 is hardly printing, and the like. Also, as illustrated in FIG. 8, even when the paste solder 30 can be printed, it may be difficult to have the printed paste solder 30 come into contact with the conductor layer 12a.

Figure 9:
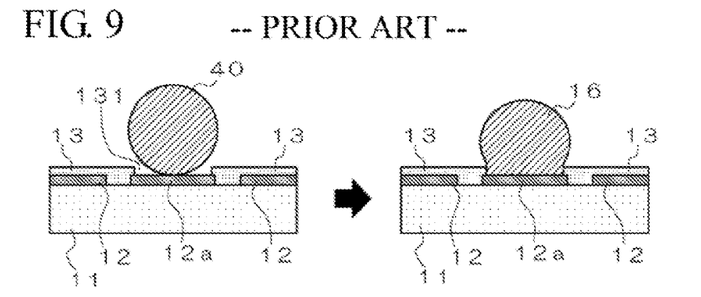
FIG. 9 is another schematic view showing a known ball mounting manufacturing method.

On the other hand, the ball mounting method is a method in which a previously formed solder ball 40 is joined onto a conductor layer 12a of a leading-out object, and the solder ball 40 is utilized, as a bump. As illustrated in FIG. 9, in the case where the thickness of the solder resist layer 13 is relatively thin and the size of the through-hole 131 opened in the solder resist layer 13 is sufficient, the solder ball 40 can be connected to the conductor layer 12a.

Figure 10:
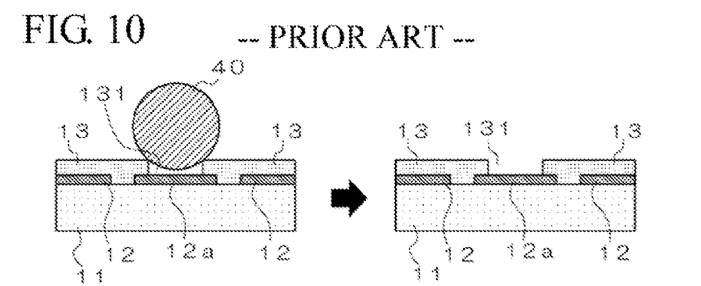
FIG. 10 is a schematic view showing a potential problem in the known ball mounting manufacturing method.

However, in the cases where the thickness of the solder resist layer 13 is relatively thick or the diameter of the through-hole 131 formed in the solder resist layer 13 is relatively small, a solder ball 40 having a size that conforms with the diameter of the through-hole 131 is used, a sufficient bump height cannot be ensured. On the other hand, as illustrated in FIG. 10, when the diameter of the solder ball 40 is made large for the purpose of ensuring the height of the bump, a curvature of the solder ball 40 decreases, so that the solder ball 40 cannot be brought into contact with the conductor layer 12a beneath the solder resist layer 13 ("cissing"). Also, there is a concern that inconvenience that the adjoining solder balls 40 connect to each other ("bridge").

Another conventional general-purpose method includes a method of plating a hump. However, since a plating solution is corrosive to a resin layer, the solder resist layer formed by adopting a photolithography method does not exhibit sufficient corrosion resistance. Also, though it is necessary to use a frame layer to determine the outline of a bump when plating a bump, it may be difficult to allow a sufficient opening to form in this frame layer that coincides with an opening formed in the solder resist layer.

In view of the foregoing long-felt problems, there remains at least a need for a wiring board that includes a conductor post and that may be used for high-density packaging.

It is an object of the present invention to provide a wiring board that addresses the above-discussed long felt needs, among others.

In order to attain the above objective, embodiments of the present invention are concerned with:

(1)

A wiring board comprising a conductor layer, a solder resist layer laminated on the conductor layer, and a conductor post that is electrically connected to a conductor layer which is disposed in a lower portion of a through-hole provided in the solder resist layer, wherein the solder resist layer comprises a thermosetting resin;

the conductor post comprises tin, copper, or a solder and includes a lower conductor post located within the through-hole and an upper conductor post located above the lower conductor post and projected outside the solder resist layer;

the lower conductor post includes an external alloy layer disposed on an external side surface thereof; and the conductor post is brought into intimate contact with an internal side surface of the through-hole via the external alloy layer.

(2)

The wiring board according to (1), wherein the external alloy layer comprises palladium and copper.

(3)

The wiring board according to (1), wherein the lower conductor post includes a lower end alloy layer disposed on a lower end surface thereof.

(4)

The wiring board according to (3), wherein the lower end alloy layer comprises palladium and copper.

(5)

The wiring board according to (4), wherein the lower end alloy layer further comprises nickel and gold.

(6)

The wiring board according to (3), wherein the external alloy layer is thicker than the lower end alloy layer.

Embodiments of the wiring board of the present invention allow for high-density packaging of a conductor post 16. That is, embodiments of the present invention allow for conductor posts 16 that have a larger aspect ratio (proportion of height to width) than those in the related art. Accordingly, conductor posts 16 with relatively small pitches can be used and may have a sufficient height from the surface of the solder resist layer. Furthermore, a highly reliable connection can be made between a wiring board 10 that has such a conductor post and a part to be packaged.

In the case where an external alloy layer 165c contains palladium and copper, a wiring board 10 may have greater joining strength between an internal side surface 131c of a though-hole 131 of a solder resist layer 13 and a lower conductor post 161, thus increasing the joining strength of the conductor post 16 relative to that in the related art.

In the case where a lower end alloy layer 165b is provided on a lower end surface 161b of the lower conductor post 161, a wiring board 10 which may have greater joining strength between the conductor post 161 and the conductor layer 12a.

In the case where the lower end alloy layer 165b contains palladium and copper, the joining strength between the conductor post 161 and the conductor layer 12a may be further increased.

In the case where the lower end alloy layer 165b further contains nickel and gold, the joining strength between the conductor post 161 and the conductor layer 12a may be even further increased.

Also, in the case where the external alloy layer 165c is thicker than the lower end alloy layer 165b, the joining strength between the conductor post 161 and a conductor layer 12 may be increased.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

An embodiment of the present invention will be described in detail by reference to FIGS. 1 to 6.

A wiring board 10 of the invention is a wiring board comprising a conductor layer 12, a solder resist layer 13 laminated on the conductor layer 12, and a conductor post 16 that is electrically connected to a conductor layer 12a which is disposed in a lower portion of a through-hole 131 provided in the solder resist layer 13, wherein the solder resist layer 13 comprises a thermosetting resin;

the conductor post 16 comprises tin, copper, or a solder and includes a lower conductor post 161 located within the through-hole 131 and an upper conductor post 162 located above the lower conductor post 161 and projected outside the solder resist layer 13;

the lower conductor post 161 includes an external alloy layer 165c disposed on an external side surface 161c thereof; and the conductor post 16 is brought into intimate contact with an internal side surface 131c of the through-hole 131 via the external alloy layer 165c.

The foregoing "wiring board (10)" comprises a conductor layer 12, a solder resist layer 13, and a conductor post 16.

The foregoing "conductor layer (12)" is a layer functioning as a conductor circuit or the like in the wiring board 10. The conductor layer 12 may be composed of a series (namely, a continuous single sheet) of conductors, or may be composed of a plurality of conductors arranged within the same plane. Also, the portion of the conductor layer 12 which is disposed in a lower portion of the through-hole 131 bored in the solder resist layer 13 as described later is "a conductor layer 12a". This conductor layer 12a may be an independent single conductor within the conductor layer 12, or may be part of continuous conductors. Also, the shape or the like of the conductor layer 12 is not particularly limited. Also, though a material of the conductor layer 12 is not particularly limited, it is preferably copper, a copper alloy, aluminum, an aluminum alloy, or the like. In certain embodiments, copper is used.

The foregoing "solder resist layer (13)" is a layer laminated on the conductor layer 12. In general, the solder resist layer 13 prevents the attachment of solder to an unintended site during the reflow process which, is utilized when packaging a part in a wiring board. Other layers such as an insulating layer, may be located between (e.g. intervene between) a solder resist layer 13 and a conductor layer 12.

Furthermore, the solder resist layer 13 in embodiments of wiring boards comprises a thermosetting resin. When the solder resist layer 13 contains a thermosetting resin, it is possible to impart resistance to a plating solution (in particular, alkali resistance) while preventing unnecessary attachment of solder during the reflow process. Accordingly, it is possible to perform at least one of electroless plating and electroplating on the surface of the conductor layer 12a that is beneath the solder resist layer 13.

Though the thickness of this solder resist layer 13 is not particularly limited, it is preferably 1 μm or more and not more than 100 μm. In certain instances, when the thickness of the solder resist layer 13 falls within this range and the configuration of the embodiment is adopted, the foregoing various effects may be more easily obtainable. The thickness of this solder resist layer 13 is more preferably 5 μm or more and not more than 50 μm, and especially preferably 10 μm or more and not more than 40 μm.

Though the kind of the thermosetting resin is not particularly limited, examples thereof include epoxy resins, polyimide resins, phenol resins, bismaleimide-triazine resins, cyanate resins, polyamide resins, and the like. Of these, epoxy resins may be especially preferable. Examples of the epoxy resins include novolak type resins, such as phenol novolak types and cresol novolak types, and dicyclopentadiene-modified alicyclic epoxy resins. The thermosetting resin utilized may be used singly or in combination with two or more kinds thereof.

Though an amount of the thermosetting resin which is contained in the solder resist layer 13 is not particularly limited, in general, the thermosetting resin is contained in the largest volumetric amount in the organic material that constitutes the solder resist layer 13. That is, the thermosetting resin may be the main component in the organic material constituting the solder resist layer 13. More specifically, when the amount of the organic material constituting the solder resist layer 13 is defined as 100% by volume, it is preferable that the thermosetting resin is contained in an amount exceeding 50% by volume, and may be as high as 100% by volume. Though the content of the thermosetting resin in the organic material constituting the solder resist layer 13 is not particularly limited, it can be preferably more than 50% by volume and not more than 100% by volume, and more preferably 80% by volume or more and not more than 100% by volume. Also, examples of other organic material, other than thermosetting resins which can be contained in the solder resist layer 13 include rubbers and thermoplastic resins.

Also, in addition to the organic material inclusive of the foregoing thermosetting resin, a filler (for example, various fillers. e.g., silica, alumina, etc.; in general, an inorganic material) or the like may be contained in the solder resist layer 13. In embodiments comprising a filler, when the whole of the solder resist layer 13 is defined as 100% by mass, the content of the filler is not more than 70% by mass.

Also, the solder resist layer 13 includes a through-hole 131, and the conductor layer 12*a* is located in a lower portion of this through-hole 131. The conductor layer 12*a* is connected to the conductor post 16 via the through-hole 131 and is electrically connected to the outside of the solder resin layer 13. Specifically, the conductor post 16 may be provided at least within the through-hole 131 and continue to the conductor layer 12*a*.

A planar shape of the through-hole 131 is not particularly limited, and it may be a circular shape, a polygonal shape, such as a quadrilateral shape, or any other workable shape. A circular shape may be preferable. Also, though the size of a through-hole 131 is not particularly limited, in general, it is sized such that only part of the conductor layer 12*a* is exposed (namely, it is preferable that the whole conductor layer 12*a* not be exposed). Furthermore, in general, the size of the opening of the through-hole 131 is equal to the size of the lower conductor post 161, and the depth of the through-hole 131 is equal to the depth of the solder resist layer 13. Also, the smaller the diameter of the through-hole 131, the more easily the above-discussed effects of embodiments of the invention are obtained. More specifically, in the case where the planar shape of the through-hole 131 is a circular shape, it is preferable that its diameter $d_{161}$ be 10 μm or more and not more than 300 μm, and its depth (thickness of the solder resist layer 13) be 1 μm or more and not more than 100 μm. In embodiments of the wiring boards 10 including such a through-hole 131, the above-discussed effects may be more easily obtainable. It is more preferable that this diameter $d_{161}$ be 10 μm or more and not more than 150 μm, and that depth be 5 μm or more and not more than 50 μm; and it is especially preferable that the diameter be 10 μm or more and not more than 100 μm, and the depth be 10 μm or more and not more than 40 μm.

The foregoing "conductor post (16)" is a conductor which is electrically connected to the conductor layer 12*a* disposed in a lower portion of the through-hole 131 which is provided in the solder resist layer 13. Alternatively, the conductor post 16 may be described as being provided at least within the through-hole 131 and that is electrically connected to the conductor layer 12*a*. The conductor post 16 functions as a conductor for connecting the conductor layer 12*a* disposed in a lower portion of the through-hole 131 to the outside of the solder resist layer 13.

Also, the conductor post 16 may be a conductor composed mainly of tin, copper, or a solder. A conductor post 16 composed mainly of tin means that in, the case where the whole of the conductor post 16 is defined as 100% by mass, the content of Sn is 95% by mass or more (preferably 97% by mass or more; the content of Sn may also be as high as 100% by mass). Also, in the case where the conductor post 16 contains other metal element than Sn, examples of other metal element include Cu, Ag, Zn, In, Bi, Sb, and Pb. The metal elements may be utilized singly or in combination with two or more kinds thereof. However, in certain conductor posts 16 not having an external alloy layer 165*c* and a lower end alloy layer 165*b*, as described later, Pd may not be used as the other element.

Similarly, a the conductor post 16 composed mainly of copper means that, in the case where the whole of the conductor post 16 is defined as 100% by mass, the content of Cu is 95% by mass or more (preferably 97% by mass or more; the content of Cu may also be as high as 100% by mass). Also, in the case where the conductor post 16 contains other metal element than Cu, examples of other metal element include Sn. The metal elements may be utilized singly or in combination with two or more kinds thereof. However, in conductor posts 16 not having an external alloy layer 165*c* and a lower end alloy layer 165*b*, as described below, Pd may not be used as the other element.

Furthermore, a the conductor post 16 is composed mainly of a solder means that, in the case where the whole of the conductor post 16 is defined as 100% by mass, a total content of two or more members selected from the group consisting of Sn, Ag, Cu, Zn, Al, Ni, Ge, Bi, In, Pb, and Au is 95% by mass or more (preferably 97% by mass or more; the total content may also be as high as 100% by mass). More specifically, examples of the solder constituting the conductor post 16 include an SnPb solder, an SnBi solder, an SnAgCu solder, an SnZnBi solder, an SnCu solder, an SnAgInBi solder, an SnZnAl solder, and an SnCuNiGe solder. Though metal elements other than the metal elements constituting the solder may be utilized, in conductor posts 16 not having an external alloy layer 165*c* and a lower end alloy layer 165*b*, as described below, Pd may not be used as the other element. Incidentally, a melting point of the conductor post 16 is generally 180° C. or higher and not higher than 250° C.

Also, the conductor post 16 includes the lower conductor post 161 located within the through-hole 131 and the upper conductor post 162 located above the lower conductor post 161 and projected outside the solder resist layer 13. In other words, the upper conductor post 162 is projected outside the solder resist layer 13, meaning that the upper conductor post 162 is projected toward the outside of the solder resist layer 13. According to this, the conductor post 16 is configured such that it is projected from the surface of the wiring board 10 and may package a part therein.

Though the shape (including the planar shape and the side surface shape) of the upper conductor post 162 is not particularly limited, for example, the planar shape can be a circular shape, a quadrilateral shape, or the like. Also, the side surface shape (shape of side section) can be a substantially circular shape, a semicircular shape, a quadrilateral shape, or the like.

Figure 3:
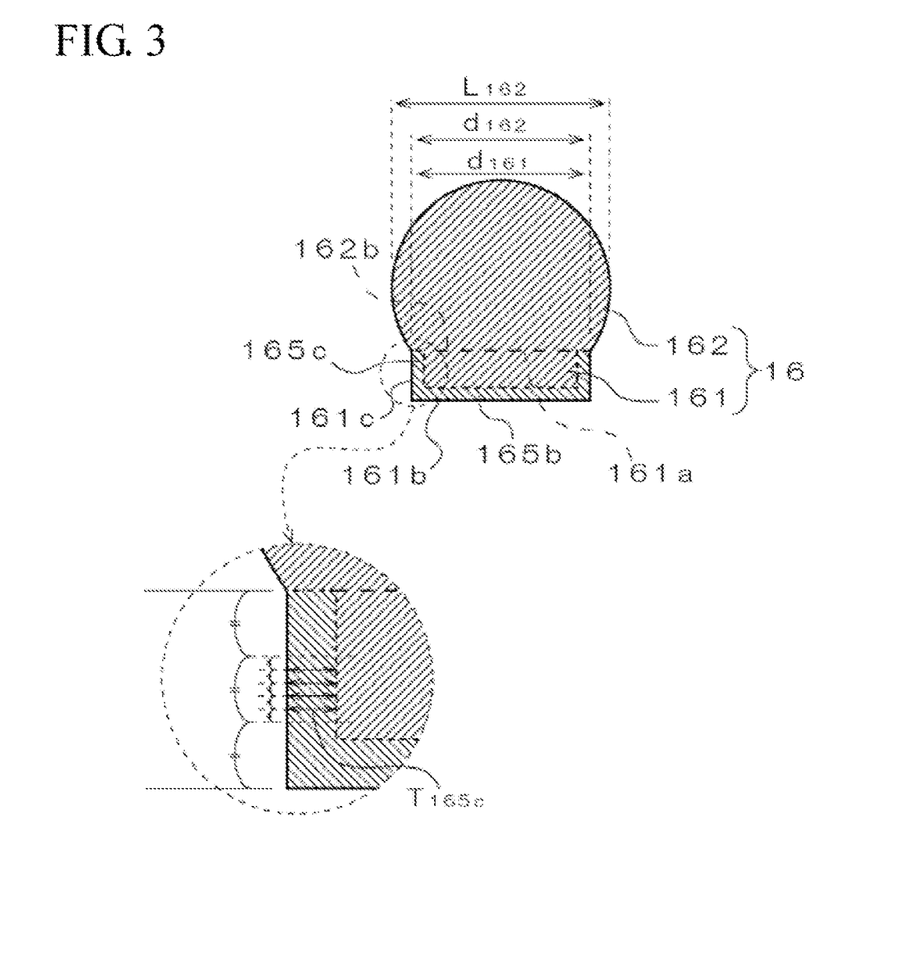
FIG. 3 is a schematic sectional view showing a conductor post arranged in a wiring board in an embodiment.

Incidentally, as shown in FIG. 3, in the conductor post 16, an upper end surface 161*a* of the lower conductor post 161 and a lower end surface 162*b* of the upper conductor post 162 have in general the same shape as each other. In particular, in the case where the planar shape is a circular shape, the diameter $d_{161}$ of the upper end surface 161a of the lower conductor post 161 and a diameter $d_{162}$ of the lower end surface 162b of the upper conductor post 162 are the same as each other. For this reason, among others, the lower end surface 162b of the upper conductor post 162 and an outer surface 132 of the solder resist layer 13 are not brought into intimate contact with each other.

Furthermore, in the case where the planar shape of the upper conductor post 162 is a circular shape, in general, the diameter $d_{162}$ of the lower end surface 162b of the upper conductor post 162 is smaller than a maximum diameter $L_{162}$ of the upper conductor post 162.

The foregoing "external alloy layer (165c)" is an alloy layer that is provided on the external side surface 161c of the lower conductor post 161. This alloy layer may be a conductor portion in which a metal component other than tin, copper, or a solder, which mainly constitutes the conductor post 16 (for example, at least one metal element selected from Pb, Ni, and Au), is diffused and contained. Magnifying a section of the conductor post 16 1,000 times or more by EPMA may allow one to perceive the alloy layer.

As shown in FIG. 3, the thickness of the external alloy layer 165c is the average length of four lines $T_{165c}$ that divide a central portion of three equal portions that define the height of the lower conductor post 161. Thus, the four lines $T_{165c}$ divide the central portion into five equal parts.

Also, for example, in the case where the conductor post 16 is composed mainly of tin (Sn), examples of the metal element diffused into the alloy layer (hereinafter referred to simply as "diffusing metal element") include Pd, Cu, and Ni. These metal elements may be used singly or in combination with two or more kinds thereof. Above all, it is preferable that Pd is contained.

Furthermore, for example, in the case where the conductor post 16 is composed mainly of copper (Cu), examples of the diffusing metal element include Pd, Sn, and Ni. These metal elements may be used singly or in combination with two or more kinds thereof. Above all, it is preferable that Pd is contained.

Also, for example, in the case where the conductor post 16 is composed mainly of a solder, examples of the diffusing metal element, which is a metal element other than the at least two metal elements that constitute the solder (solder metal element) that may be selected from the group consisting of Sn, Ag, Cu, Zn, Al, Ni, Ge, Bi, In, Pb, and Au, include Pd and Ni. These metal elements may be used singly or in combination with two or more kinds thereof. It is preferable that Pd not be included as the solder metal element, but Pd be used as the diffusing metal element.

Also, it is preferable that the wiring board 10 of the invention includes, in addition to the external alloy layer 165c, a lower end alloy layer 165b on the lower end surface 161b of the lower conductor post 161. When this lower end alloy layer 165b is provided, and furthermore, the conductor post 16 is brought into intimate contact with the conductor layer 12a via the lower end alloy layer 165b, an enhanced joining strength may be obtainable.

The lower end alloy layer 165b is an alloy layer which is provided on the lower end surface 161b of the lower conductor post 161. Similar to the external alloy layer 165c, this alloy layer is a conductor portion in which a metal component other than tin, copper, or a solder which mainly constitutes the conductor post 16 (for example, at least one metal element selected from Pb, Ni, and Au) is diffused and contained. By magnifying a section of the conductor post 16 1,000 times or more by EPMA, one may perceive the alloy layer.

Similar to the case of the external alloy layer 165c, a thickness of the lower end alloy layer 165b is an average value length of four lines dividing a central portion of three equal portions that define the width of the lower conductor post 161. Theses four lines divide the central portion of the lower conductor post 161 into five equal parts.

Also, for example, in the case where the conductor post 16 is composed mainly of tin (Sn), examples of the diffusing metal element within the alloy layer include Pd, Cu, Ni, Au, and Ag. These metal elements may be used singly or in combination with two or more kinds thereof. Pd, Cu, Ni, or Au are preferable, and Pd or Cu are especially preferable.

Furthermore, for example, where the conductor post 16 is composed mainly of copper (Cu), examples of the diffusing metal element include Pd, Sn, Ni, Au, and Ag. These metal elements may be used singly or in combination with two or more kinds thereof. Pd, Ni, or Au are preferable.

Also, for example, in the case where the conductor post 16 is composed mainly of a solder, examples of the diffusing metal element, which is a metal element other than the at least two metal elements comprising the solder metal element constituting the solder and selected from the group consisting of Sn, Ag, Cu, Zn, Al, Ni, Ge, Bi, In, Pb, and Au, include Pd, Ni, and Au. These metal elements may be used singly or in combination with two or more kinds thereof. In particular, it is preferable that Pd not be included as the solder metal element, and Pd be utilized as the diffusing metal element. Furthermore, it is preferable that not only Pd, Ni, and Au not be included as the solder metal element, but Pd, Ni, and Au be utilized as the diffusing metal element.

Furthermore, it is preferable that the external alloy layer 165c of an alloy layer 165, which includes the external alloy layer 165c and the lower end alloy layer 165b, be thicker than the lower end alloy layer 165b of the alloy layer 165. Accordingly, the conductor post 16 may have a increased joining strength.

Palladium that may be contained in the alloy layer 165 is a component used for the treatment which is previously applied for the purpose of forming an electroless plated layer 14. In general, palladium is coated as a catalyst containing palladium and contained in the electroless plated layer 14 formed on the internal side surface 131c of the through-hole 131 which is bored in the solder resist layer 13 (see the form after a process PR9 in FIG. 6, and the like). Then, since this electroless plated layer 14 becomes a part of the conductor post 16 by a treatment such as heating, as described later, palladium is contained in the external side surface 161c of the lower conductor post 161 and is able to reinforce the joining strength to the internal side surface 131c of the through-hole 131 which is bored in the solder resist layer 13, as a part of the conductor post 16. Also, when heat is applied, such as during the manufacturing process of a wiring board 10, the electroless plated layer 14 and the conductor post 16 are allowed to form an alloy at an interface therebetween (diffusion of the diffusing metal element forms an alloy layer) (namely, though the temperature may be equal to or greater than the melting point of the conductor post 16, for example, heating is performed at 250° C. or higher). The electroless plated layer 14 itself becomes absent within the wiring board 10, whereby palladium is contained as the external alloy layer 165c constituting the external side surface of the conductor post 16 (see FIG. 3).

Furthermore, in the lower end alloy layer 165b that is an intimate contact site for the conductor layer 12a of the lower conductor post 161, nickel and gold can be contained. When nickel and gold are contained in this lower end alloy layer 165*b*, the joining strength between the lower conductor post 161 and the conductor layer 12*a* is enhanced. Such nickel and gold can be contained in the lower end alloy layer 165*b* by forming an intervening layer 17 in a manufacturing method of a wiring board, as described later.

In this lower end alloy layer 165*b*, in addition to nickel and gold, other component can also be contained. Examples of other component include palladium. In particular, in the case where the conductor post 16 is composed mainly of tin or a solder, when nickel and gold are simultaneously contained in this lower end alloy layer 165*b*, the formation of a component with lower joining strength in the lower end alloy layer 165*b* (for example, a component in which the respective metal elements are contained in a composition ratio of Cu to Sn of 6/5) can be effectively suppressed. As a result, the conductor post 16 may have a more excellent joining strength.

Also, the wiring board can be provided with configurations other than the solder resist layer, the conductor layer, and the conductor post. Examples of other configurations include a core substrate, an insulating layer, and an interior part.

Of these, the core substrate comprises an insulating material and is generally a plate-shaped material. Also, the core substrate can form a central part in a thickness direction of the wiring board 10. The insulating material that constitutes the core substrate may preferably be formed from an insulating resin, and examples thereof include epoxy resins and bismaleimide-triazine resins. Also, a reinforcing material (for example, reinforcing fibers such as glass fibers), a filler (for example, various fillers such as silica and alumina), and the like may be contained in the core substrate. That is, for example, fiber reinforced resin plates such as a glass fiber reinforced epoxy resin plate or the like, heat resistant resin plates such as a bismaleimide-triazine resin plate, and the like can be used as the core substrate. Also, this core substrate may be composed of plural layers, and furthermore, it may have a conductor layer (inner layer pattern) in the inside thereof. Also, the insulating layer functions to insulate a space between the conductor layers laminated on the core substrate. This insulating layer can be constituted of the same insulating material as the insulating material constituting the core substrate.

Furthermore, in the case where the wiring board of the invention includes an accommodating part in the inside thereof, the wiring board is able to have an interior part within the accommodating part.

The planar shape of the accommodating part is not particularly limited, and for example, it may be a substantially quadrilateral shape (inclusive of a quadrilateral and a quadrilateral whose corners are chamfered), or it may be a substantially circular shape (inclusive of a true circular shape and an elliptical shape), or the like. Also, examples of the interior part include a capacitor, an inductor, a filter, a resistor, and a transistor. These materials may be used singly or in combination with two or more kinds thereof. Of these, a capacitor is preferable, such as a laminated ceramic capacitor. Furthermore, a tilling part in which an insulating material that functions to relieve thermal expansion coefficient characteristics between the interior part and the core substrate can be included in a gap between the interior part internally installed within the accommodating part and the accommodating part. In general, the filling part is composed of a resin such as epoxy resins, silicone resins, polyimide resins, bismaleimide-triazine resins, urethane resins, and phenol resins, or it may be composed of a mixture of such a resin and an inorganic filler such as ceramics with low thermal expansion (for example, silica, alumina, etc.), dielectric ceramics (for example, barium titanate, strontium titanate, lead titanate, etc.), heat-resistant ceramics (for example, alumina nitride, boron nitride, silicon carbide, silicon nitride, etc.), and glasses (for example, borosilicate based glass, etc.).

The following describes an exemplary embodiment of a method of manufacturing a wiring board.

In the case of manufacturing an embodiment of a wiring board of the present invention, though its manufacturing method is not particularly limited, the wiring board can be obtained by the following method. That is, the wiring board can be obtained by a manufacturing that includes a solder resist layer forming process PR1, a first through-hole boring process PR2, an electroless plated layer forming process PR4, a photoresist layer forming process PR5, a second through-hole boring process PR6, a conductor post forming process PR7, a photoresist layer removing process PR8, and a conductor post heating process PR10 in this order.

The foregoing "solder resist layer forming process (PR1)" is a process of forming the solder resist layer 13 containing a thermosetting resin on a surface of a plain substrate 20 having the conductor layer 12 provided on the surface thereof (though the conductor layer 12 may be formed entirely on the surface of the plain substrate 20, in general, it is formed in a part of the surface of the plain substrate 20). Though the configuration of the plain substrate 20 is not particularly limited, it can include, in addition to the conductor layer 12, a core substrate, an insulating layer, and the like. That is, for example, a plain substrate 20 may include a conductor layer 12 in which the surface of the conductor layer is a double-sided copper-clad plate having a glass epoxy as a core 11 and that is subjected to patterning. Furthermore, for example, if a plain substrate 20 having a double-sided copper-clad plate composed of glass epoxy core is used as a core substrate, an insulating layer may be successively built up, a conductor layer may be connected between the respective insulating layers, and the patterned conductor layer 12 can be disposed on the topmost surface thereof.

A method of forming the solder resist layer 13 on the plain substrate 20 is not particularly limited, and the solder resist layer 13 can be obtained by (1) a method in which a liquid solder resist composition is coated on the surface of the plain substrate 20, followed by drying and curing (semi-curing), if desired. Furthermore, the solder resist layer 13 can be obtained by (2) a method in which a dry film serving as the solder resist layer 13 is stuck on the surface of the plain substrate 20, followed by drying and curing (semi-curing), if desired. Also, in the case of utilizing the foregoing method (1), the liquid solder resist composition can be coated on the plain substrate 20 by an appropriate coating method such as spin coating, cast coating, and roll coating. Incidentally, the thickness of the solder resist layer 13 is as described above.

The foregoing "first through-hole boring process (PR2)" is a process of boring a first through-hole 131 in the solder resist layer 13. In this process, the first through-hole 131 may be formed by adopting a photolithography method, or the first through-hole 131 may be formed by adopting a laser boring method. Incidentally, as for the first through-hole 131, the method for the through-hole 131 formed in the solder resist layer 13, which is described above, can be applied.

The foregoing "electroless plated layer forming process (PR4)" is a process of coating a palladium-containing catalyst within the first through-hole 131 after the first through-hole boring process PR2 and before the photoresist layer forming process PR5 and then forming the electroless plated layer 14 containing copper. According to this, the electroless plated layer 14 is formed, and the external alloy layer 165*c* containing palladium in the external side surface 161c of the lower conductor post 161 can be obtained through process PR10, as described later.

The foregoing palladium-containing catalyst can be formed by coating with a liquid such as a $PdCl_2$ aqueous solution or a Sn—Pd colloid solution, and coating a necessary surface or dipping a substrate therein, thereby attaching such a solution, followed by drying. For example, the $PdCl_2$ aqueous solution may obtained by combining an alkali with a mixed solution of palladium chloride and hydrochloric acid, and the Sn—Pd colloid solution may obtained by combining palladium chloride, stannous chloride, and hydrochloric acid.

Also, the electroless plated layer 14 can comprise an electrically conductive metal including at least one of copper, nickel, and tin. This electroless plated layer 14 is preferably made of copper. The electroless copper plated layer 14 can be formed by dipping in an electroless copper plating solution containing a copper salt (for example, $CuSO_4$, etc.), a reducing agent (for example, formaldehyde, etc.), a complexing agent (for example, a Rochelle salt, EDTA, etc.), a pH modifier (for example, NaOH, KOH, etc.), an additive (for example, polyethylene glycol, dipyridyl, etc.), or the like.

The foregoing "photoresist layer forming process (PR5)" is a process of forming a photoresist layer 15 so as to cover the plain substrate 20 obtained. That is, this process is a process of forming a photoresist layer 15 on the solder resist layer 13 having at least the first through-hole 131 bored therein directly or indirectly via another layer.

A method of forming the photoresist layer 15 is not particularly limited, and the photoresist layer 15 can be obtained by (1) a method in which a liquid photoresist composition is coated on the surface of the solder resist layer 13 directly or indirectly via another layer, followed by drying and curing (semi-curing), if desired. Furthermore, the photoresist layer 15 can be obtained by (2) a method in which a dry film serving as the photoresist layer 15 is stuck on the surface of the solder resist layer 13 directly or indirectly via other layer, followed by drying and curing (semi-curing), if desired. In the case of utilizing the foregoing method (1), the liquid photoresist composition can be coated on the solder resist layer 13 by an appropriate coating method such as spin coating, cast coating, and roll coating. On the other hand, in the case of utilizing the foregoing method (2), the dry film can be brought into intimate contact with the solder resist layer 13 upon being pressed. In that case, though pressing may be performed by using a batch type press, the pressing can be performed while allowing the dry film to pass through a manufacturing line, and therefore, a roller type press or the like can be used.

Though the thickness of the photoresist layer 15 is not particularly limited, it is preferably 1 µm or more and not more than 500 µm. In the case where the thickness of the photoresist layer 15 falls within this range, the upper conductor post 162 can be formed and be sufficiently projected outside the solder resist layer 13, allowing for satisfactory connection to outside elements via the conductor post 16. The thickness of this photoresist layer 15 is more preferably 5 µm or more and not more than 300 µm, and especially preferably 10 µm or more and not more than 100 µm.

The foregoing "second through-hole boring process (PR6)" is a process of boring, in the photoresist layer 15, a second through-hole 151 which is allowed to communicate with the first through-hole 131 and which has a diameter substantially the same as that of the first through-hole 131 (in general, a ratio of a hole diameter A of the first through-hole to a hole diameter B of the second through-hole (A/B) is in the range of 0.8 or more and less than 1.0) by adopting a photolithography method. The second through-hole 151 is a through-hole bored in the photoresist layer 15 and is a hole that penetrates to the solder resist layer 12. Also, the second through-hole 151 is a hole serving as a mold for forming the upper conductor post 162, which is located above the lower conductor post 161 of the conductor post 16 and that is projected outside the solder resist layer 13.

The foregoing "conductor post forming process (PR7)" is a process of plating the conductor post 16 composed mainly of tin, copper, or a solder within the first through-hole 131 and the second through-hole 151. In this process PR7, any plating means may be adopted. That is, for example, the conductor post 16 may be formed by means of electroplating, or the conductor post 16 may be formed by means of electroless plating. In this conductor post forming process PR7, since the conductor post 16 is plated, as described above, the conductor post 16 becomes a conductor composed mainly of tin, copper, or a solder. For embodiments comprising tin, copper, or a solder as a main component, the explanation described above for the conductor post 16 can be applied.

The foregoing "photoresist layer removing process (PR8)" is a process of removing the photoresist layer 15. That is, the process PR8 is a process of not only removing the photoresist layer 15 but exposing the conductor post 16 to the substrate. The removal of the photoresist layer 15 may be performed by any method. For example, the photoresist layer 15 may be burnt down (reduced to ashes) by applying a laser, heat, or the like, or it may be dissolved and removed by using a solvent or the like. In particular, in the case of using a positive working photoresist as the photoresist, the photoresist layer 15 can be removed simply and easily with a solvent.

The foregoing "conductor post heating process (PR10)" is a process of heating (inclusive of reflowing) the conductor post 16 after the photoresist layer removing process PR8. This conductor post heating process PR10 is a process which effectively functions in the case where in the conductor post forming process PR7 a conductor post 16 made of tin or the like is plated within both holes of the first through-hole 131 and the second through-hole 151.

A maximum attained temperature during reflowing is preferably at least 30° C. higher than a melting point of the conductor post. By performing this conductor post heating process PR10, in the case where the electroless plated layer 14, the intervening layer 17, and the like are previously formed before the conductor post forming process PR7, the alloy layer 165 in which the components constituting these layers have been incorporated on the surface of the conductor post 16 can be formed. When the alloy layer 165 is formed, the wiring board 10 and conductor post 16 may be more firmly arranged.

Furthermore, by performing this conductor post heating process PR10, the shape of the conductor post 16 can be corrected up until process PR10. That is, according to this heating, not only is the conductor post 16 moderately dissolved, but the dissolved upper conductor post 162 can be corrected in terms of a contortion of the shape of the upper conductor post 162 due to its surface tension, and therefore can be rounded. Moreover, the position of the upper conductor post 162 can be corrected so as to allow an axial center thereof to coincide with the conductor layer 12a due to a self-alignment effect. According to these actions, the wiring board 10 may have a conductor post 16 that is more reliable.

Figure 6:
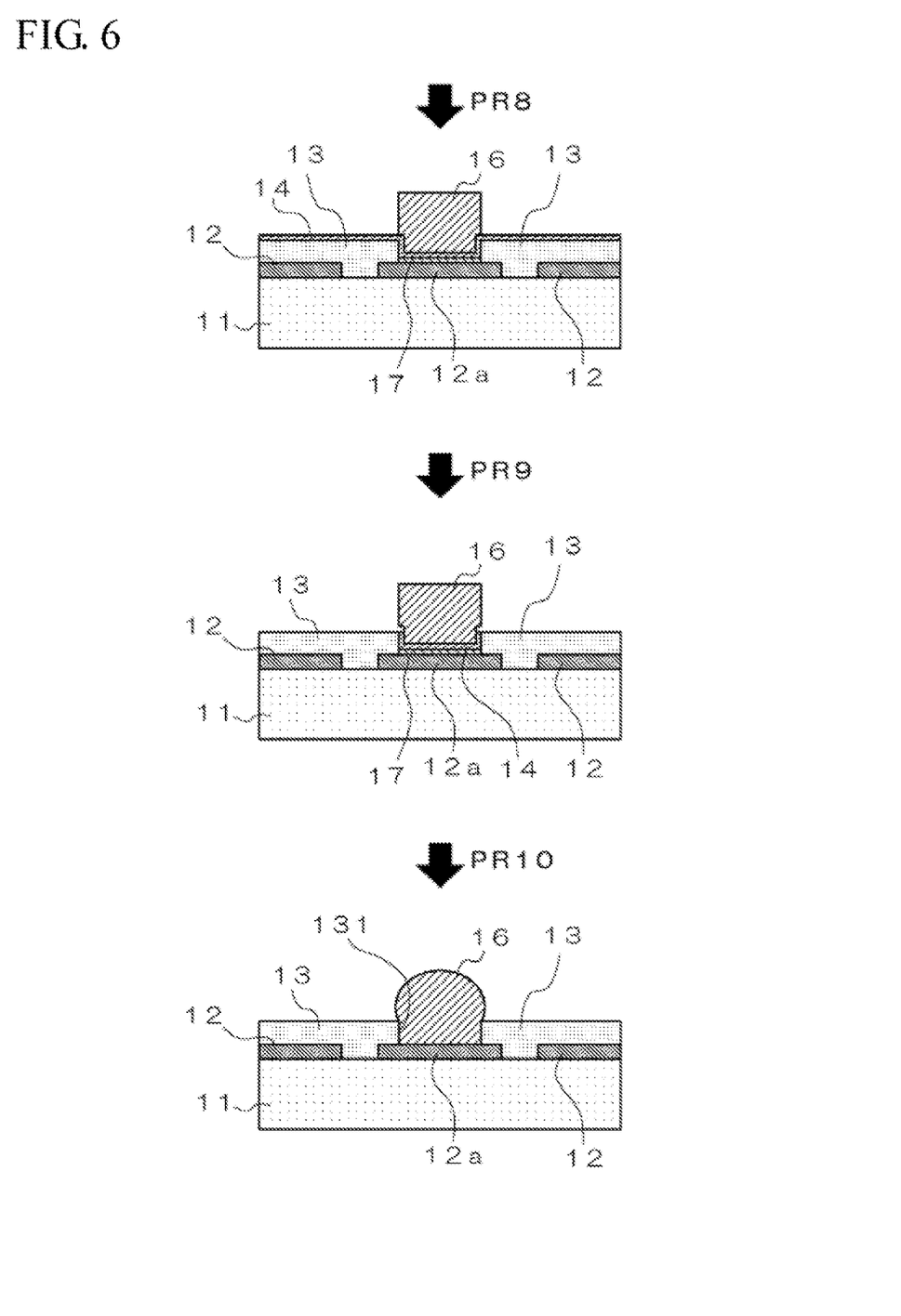
FIG. 6 is a schematic process chart following FIG. 5 showing a manufacturing method of a wiring board in an embodiment.

Also, as illustrated by the stage after the process PR9 in FIG. 6, in the case where the electroless plated layer 14 is formed between the lower end surface 162b of the upper conductor post 162 and the surface 132 of the solder resist layer 13, in particular, the adhesion therebetween can be enhanced.

The heating condition in the conductor post heating process PR10, or the like is not particularly limited so long as the maximum attained temperature is a melting point of the conductor post 16 or higher. However, for example, it is preferable that the conductor post 16 is allowed to reflow at a temperature of 100° C. or higher and not higher than 400° C. in a nitrogen atmosphere, thereby effecting heating and dissolution. When the temperature falls within this range, the foregoing self-alignment effect can also be obtained while moderately accelerating the formation of the alloy layer 165. This temperature is more preferably 150° C. or higher and not higher than 300° C., and especially preferably 180° C. or higher and not higher than 260° C.

In the manufacturing method of the wiring board according to the invention, in addition to the foregoing respective processes, other process can be included. Examples of other processes include an intervening layer forming process PR3. These processes may be adopted singly or in combination of two or more kinds thereof.

The foregoing "intervening layer forming process (PR3)" is a process of forming an electrically conductive intervening layer 17 containing nickel and gold on the surface of the conductor layer 12a exposed within the first through-hole 131 before the electroless plated layer forming process PR4. By allowing this intervening layer 17 as a primary coat to intervene between the electroless plated layer 14 and the conductor layer 12a before forming the electroless plated layer 14, the formation of a component which lowers the joining strength in the course where the electroless plated layer 14 becomes the alloy layer 165 (for example, a component in which the respective metal elements are contained in a composition ratio of Cu to Sn of 6/5) can be effectively suppressed. As a result, the wiring board 10 may have a conductor post 16 with greater joining strength. For example, by applying electroless nickel plating to form an electroless nickel plated layer and then applying electroless gold plating, an electroless gold plated layer is formed on the electroless nickel plated layer, whereby the intervening layer 17 can be obtained.

The intervening layer 17 which is formed in this process PR3 is not particularly limited on its composition and the like. For example, in the case where the intervening layer 17 is formed of an electroless nickel plated layer and an electroless gold plated layer, the whole of the electroless nickel plated layer being defined as 100% by mass, the content of nickel is preferably from 90 to 95% by mass. Furthermore, when the whole of the electroless gold plated layer in the intervening layer 17 is defined as 100% by mass, the content of gold is preferably from 95 to 100% by mass. In the case where the content of each of nickel and gold falls within this range, it may be possible to avoid forming a component that may lower the joining strength.

Also, though a thickness of the intervening layer 17 is not particularly limited, it is preferably 1 µm or more and not more than 20 µm. In the case where the thickness of the intervening layer 17 falls within this range, it may be possible to avoid forming a component that may lower the joining strength. The thickness of the intervening layer 17 is more preferably 3 µm or more and not more than 15 µm, and especially preferably 6 µm or more and not more than 12 µm.

In the method according to and embodiment the present invention, in addition to the foregoing respective processes, other process can be included. Examples of other process include a desmearing process. The desmearing process can be performed after forming the first through-hole 131, after forming the second through-hole 151, or the like. By performing this desmearing process, a residue within the through-hole can be removed.

Furthermore, as illustrated by process PR9 in FIG. 6, there is exemplified the electroless plated layer removing process PR9 of removing an unnecessary site of the electroless plated layer 14, in which the conductor post 16 is not formed on the surface thereof, so that the electroless plated layer 14 is exposed onto the surface as it is, by means of etching or the like.

These processes may be adopted singly or in combination of two or more kinds thereof.

Embodiment

A specific embodiment of a wiring board 10 of the present invention is more described below with respect to the following Embodiment. This non-limiting description should not be construed to limit the invention to this Embodiment.

(1) Wiring Board 10:

A wiring substrate 10 (see FIG. 1) which is manufactured according to this Embodiment includes a conductor layer 12 laminated on the side of one surface of a core substrate 11, a solder resist layer 13 laminated on this conductor layer 12, and a conductor post 16 to be electrically connected to a conductor layer 12a which is disposed in a lower portion of a through-hole 131 provided in the solder resist layer 13.

Figure 1:
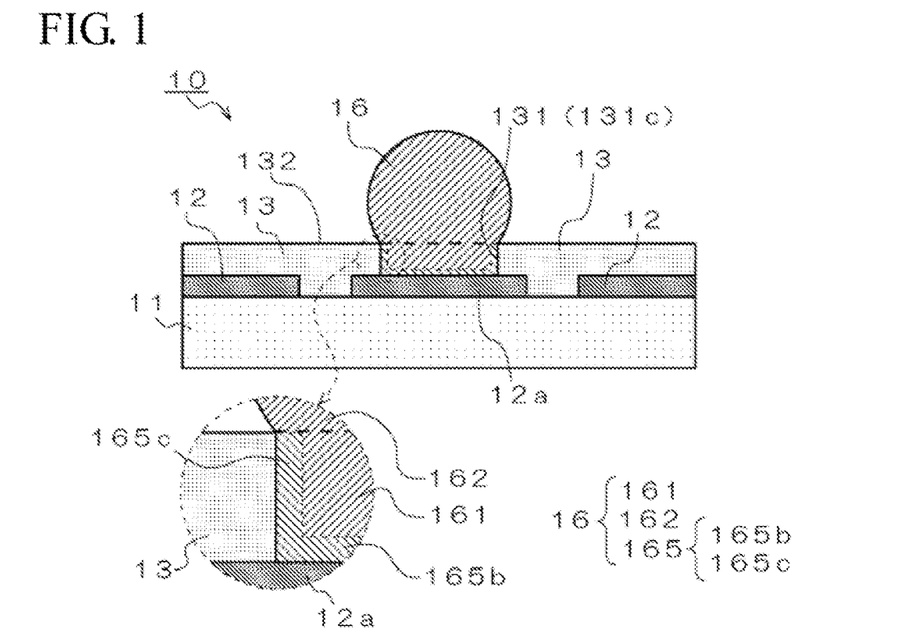
FIG. 1 is a schematic sectional view showing a wiring board in an embodiment.
Figure 2:
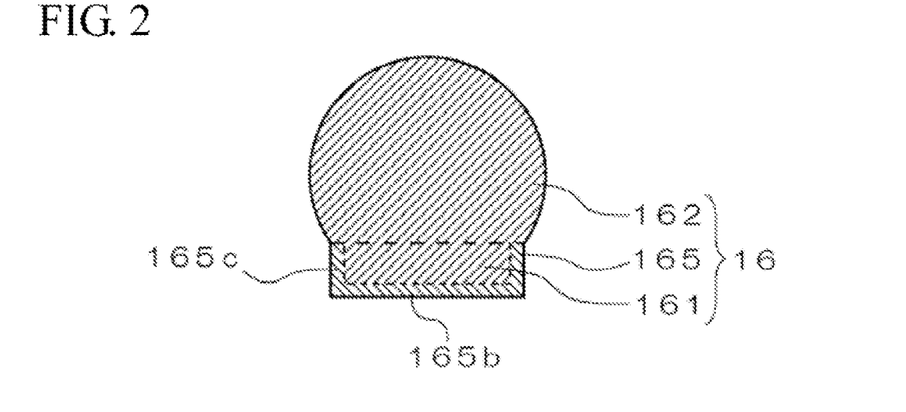
FIG. 2 is a schematic sectional view showing a conductor post arranged in a wiring board in an embodiment.

Alternatively, the Embodiment may comprise a conductor layer 12 laminated on the side of one surface of a core substrate 11, a solder resist layer 13 laminated on the conductor layer 12 that includes a through-hole 131, and a conductor post 16 provided at least within the through-hole 131 and that is electrically connected to the conductor layer 12, and specifically a conductor layer 12a disposed in a lower portion of the through-hole 131.

The core substrate 11 is composed of glass epoxy (epoxy resin containing glass fibers as a core material) having a thickness of 0.8 mm. Also, the conductor layer 12 is one obtained by patterning a copper foil having a thickness of 12 µm on one surface of the core substrate 11.

Furthermore, the solder resist layer 13 has a thickness of 21 µm and contains an epoxy resin that is a thermosetting resin (the solder resist layer 13 contains 40% by mass of a filler made of silica and 60% by mass of an organic material, and furthermore, the organic material contains 80% by volume of an epoxy resin based on 100% by volume of the whole thereof). The through-hole 131 bored in the solder resist layer 13 has a circular shape having an aperture of 64 µm and penetrates the back and front sides of the solder resist layer 13 to reach the conductor layer 12a beneath the solder resist layer 13.

The conductor post 16 at least fills the through-hole 131 and is composed of a lower conductor post 161 having a diameter ($d_{161}$) of 64 µm and a height of 21 µm and an upper conductor post 162 located on this lower conductor post 161 and having a lower end surface diameter ($d_{162}$) of 64 µm, a maximum diameter ($L_{162}$) of 74 µm and a height (at the highest position) of 58 µm.

Also, the lower conductor post 161 includes an external alloy layer 165c having an average thickness of 2 µm on an external side surface 161c and a lower end alloy layer 165b having an average thickness of 1 µm on a lower end surface 161b. That is, the external alloy layer 165c is twice the thickness of the lower end alloy layer 165b.

Furthermore, the conductor post (inclusive of an alloy layer 165) contains 95% by mass of tin based on 100% by mass of the whole conductor post 16. The remainder is palladium, copper, nickel, and gold contained as components constituting the alloy layer 165.

The manufacturing method of this wiring board 10 is hereunder described by reference to FIGS. 4 to 6. To simplify matters, the substrate manufactured in each of the processes and the substrates in the respective processes before they becoming a wiring board 10 are all referred to as a plain substrate 20.

Figure 4:
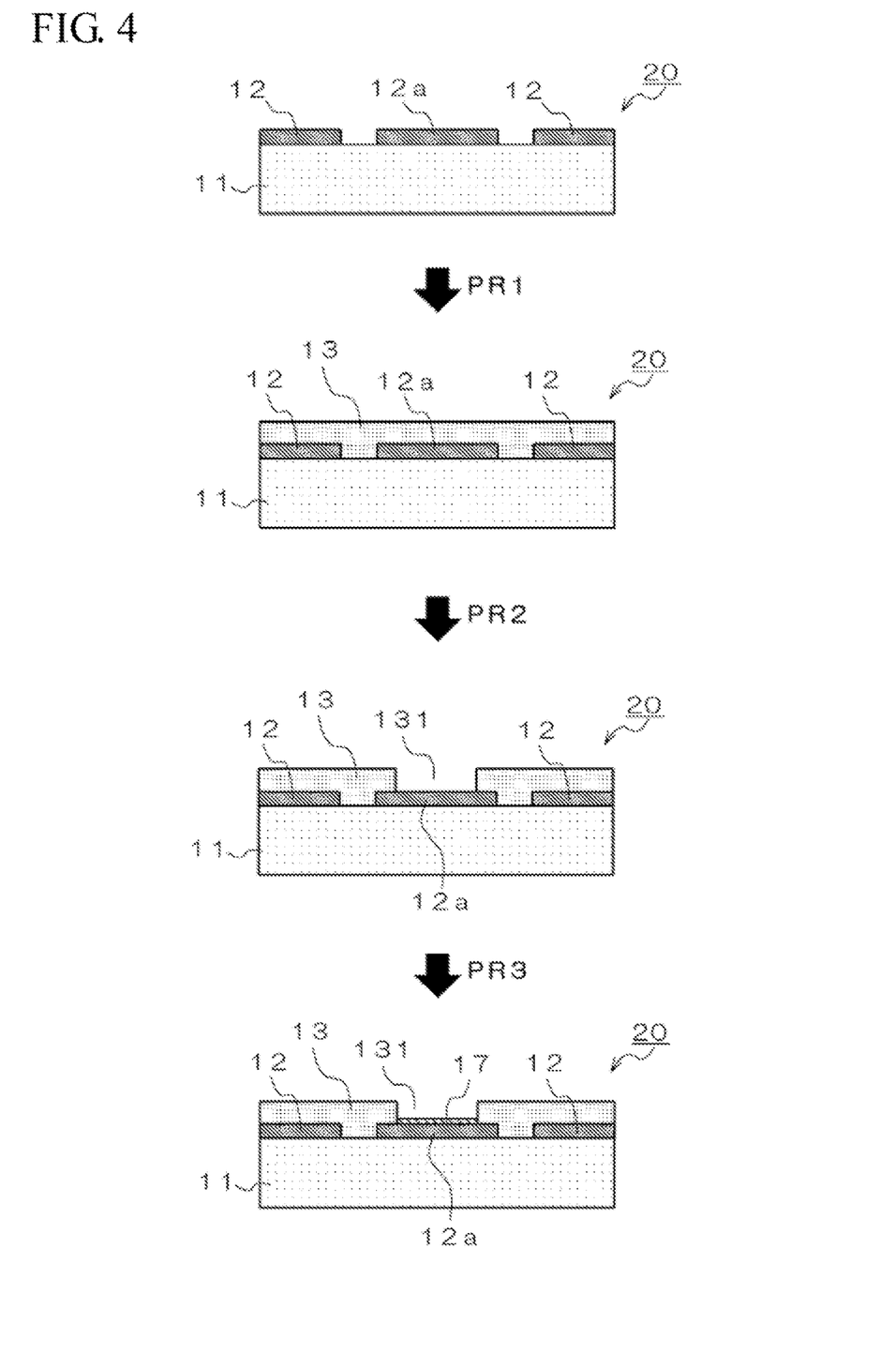
FIG. 4 is a schematic process chart showing a manufacturing method of a wiring board in an embodiment.
Figure 5:
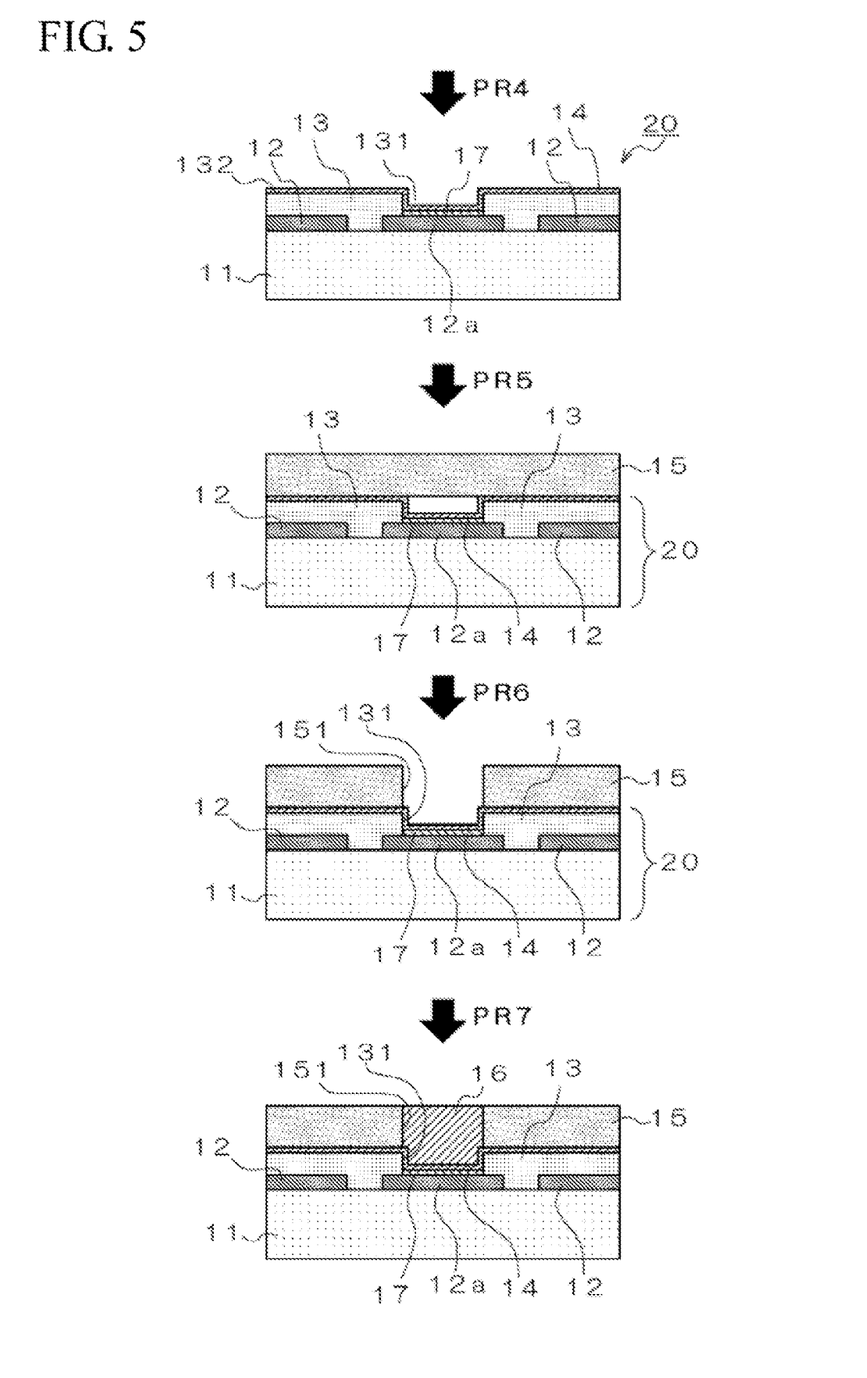
FIG. 5 is a schematic process chart following FIG. 4 showing a manufacturing method of a wiring hoard in an embodiment.

A plain substrate 20 before process PR1 is prepared (FIG. 4). This plain substrate 20 includes a core substrate 11 composed of glass epoxy (epoxy resin containing glass fibers as a core material) having a thickness of 0.8 mm and a conductor layer 12 obtained by patterning a copper foil having a thickness of 12 µm on one surface of the core substrate 11.

(2) Solder Resist Layer Forming Process PR1:

A film-like solder resist layer forming composition containing an epoxy resin that is a thermosetting resin is stuck on to the side surface of the conductor layer 12 of the plain substrate 20 of the foregoing process (1). The composition is then heated for curing, thereby obtaining a thermosetting resin-containing solder resist layer 13 having a thickness of 21 µm.

(3) First Through-Hole Boring Process PR2:

A laser is irradiated on the solder resist layer 13 obtained in the foregoing (2) from the surface side, thereby boring a first through-hole 131 having a diameter of 60 µm. According to this, a conductor layer 12a beneath the solder resist layer 13, for which continuity is necessary, is exposed. Also, thereafter, a desmearing treatment is performed for the purpose of removing a smear within the through-hole 131.

(4) Intervening Layer Forming Process PR3:

An electroless nickel plated layer is formed on the surface of the exposed conductor layer 12a beneath the solder resist layer 13 of the plain substrate 20 having been subjected to a smearing treatment, as obtained until the foregoing (3), by means of electroless nickel plating, and thereafter, an electroless gold plated layer is formed by means of electroless gold plating, thereby forming an electrically conductive intervening layer 17 containing nickel and gold. The resulting intervening layer 17 contains 93% of nickel in the case of defining the whole of the electroless nickel plated layer as 100% by mass and 100% by mass of gold in the case of defining the whole of the electroless gold plated layer as 100%, respectively and has a thickness of 10 µm.

(5) Electroless Plated Layer Forming Process PR4:

The plain substrate 20 is dipped in a palladium catalyst solution containing a tin salt, sodium chloride, and the like and then dried, thereby forming a palladium-containing catalyst nucleus on the whole surface (inclusive of the inside of the through-hole 131) of the surface (side on which the solder resist layer 13 is provided) of the plain substrate 20 including the intervening layer 17 as obtained until the foregoing (4). Subsequently, the plain substrate 20 in which the catalyst nucleus has been formed is dipped in an electroless Cu plating solution containing a nickel salt, copper sulfate, sodium hydroxide, a chelating agent, a complexing agent, and the like and then dried, thereby forming an electroless copper plated layer 14. The resulting electroless copper plated layer 14 has a thickness of 0.7 µm.

(6) Photoresist Layer Forming Process PR5:

A dry film type photoresist layer 15 having a thickness of 75 µm is contact bonded onto the surface of the plain substrate 20 on which the electroless copper plated layer 14 is formed, as obtained until the foregoing (5).

(7) Second Through-Hole Boring Process PR6:

A second through-hole 151 which is allowed to communicate with the first through-hole 131 and which has a diameter that is the same as that of the first through-hole 131 is bored in a laminate having the photoresist layer 15 laminated on the surface of the plain substrate 20, as obtained until the foregoing (6), using a photolithography method. That is, the second through-hole 151 is formed through an exposure process, a development process, and the like. According to this, the surface (partial surface) of the electroless copper plated layer 14 beneath the photoresist layer 15 is exposed within the second through-hole 151.

(8) Conductor Post Forming Process PR7:

The laminate having the second through-hole 151 formed in the photoresist layer 15 as obtained until the foregoing (7) is dipped in an electroless plating solution for electroplating, and the insides of both the first through-hole 131 and the second through-hole 151 are filled up with a tin plating, thereby forming a conductor post 16.

(9) Photoresist Layer Removing Process PR8:

The photoresist layer 15 is removed from the surface of the laminate having the conductor post 16 formed therein as obtained until the foregoing (8) by dipping in an amine based stripping solution.

(10) Electroless Plated Layer Removing Process PR9:

An unnecessary portion of the electroless copper plated layer 14 which is exposed on the surface of the solder resist layer 13 in the plain substrate 20 including the conductor post 16 as obtained until the foregoing (9) is removed by spraying a sulfuric acid/hydrogen peroxide based solution and etching.

(11) Conductor Post Heating Process PR10:

The plain substrate 20 from which the unnecessary portion of the electroless copper plated layer 14 has been removed, as obtained until the foregoing (10), is subjected to reflowing for heat melting at a temperature equal to or greater than the melting point of the conductor post in a prescribed furnace. Specifically, a temperature equal to or greater than the melting point is kept for 50 seconds, with the maximum temperature being 240° C. Accordingly, as shown in FIG. 6, alloying (diffusion of metal elements) is accelerated at the interface of each of the intervening layer 17, the electroless copper plated layer 14, and the tin plating, causing the conductor post 16 to become an integrated single conductor and the external alloy layer 165c and the lower end alloy layer 165b to form. Furthermore, the conductor post 16 approaches the central axis of the conductor layer 12a due to a self-alignment effect and is also molded into a circular form due to a surface tension of molten tin.

The invention can be widely utilized in electronic part-related fields. Embodiments of the wiring board of the invention are utilized for usual wiring boards such as motherboards: wiring boards for mounting semiconductor devices such as wiring boards for flip chip, SCPs, and MCPs; wiring boards for modules such as wiring boards for antenna switch modules, mixer modules, PLL modules, and for MCMs; and the like.

What is claimed is:

1. A wiring board comprising a conductor layer, a solder resist layer laminated on the conductor layer, and a conductor post that electrically connected to a conductor layer which is disposed in a lower portion of a through-hole provided in the solder resist layer, wherein the solder resist layer comprises a thermosetting resin;

the conductor post comprises tin, copper, or a solder and includes a lower conductor post located within the through-hole and an upper conductor post located above the lower conductor post and projected outside the solder resist layer;

the lower conductor post includes an external alloy layer disposed on an external side surface thereof; and the conductor post is brought into intimate contact with an internal side surface of the through-hole via the external alloy layer.

2. The wiring board according to claim 1, wherein the external alloy layer comprises palladium and copper.

3. The wiring board according to claim 1, wherein the lower conductor post includes a lower end alloy layer disposed on a lower end surface thereof.

4. The wiring board according to claim 3, wherein the lower end alloy layer comprises palladium and copper.

5. The wiring board according to claim 4, wherein the lower end alloy layer further comprises nickel and gold.

6. The wiring board according to claim 3, wherein the external alloy layer is thicker than the lower end alloy layer.

* * * * *